United States Patent
Lin et al.

(10) Patent No.: US 6,221,203 B1
(45) Date of Patent: Apr. 24, 2001

(54) APPARATUS AND METHOD FOR CONTROLLING TEMPERATURE OF A CHAMBER

(75) Inventors: Ruey Horng Lin, Yeong her; Yi Lang Wu, Pin Jenn, both of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/323,344

(22) Filed: Jun. 1, 1999

(51) Int. Cl.⁷ .................................................. H01L 21/00
(52) U.S. Cl. ...................... 156/345; 118/724; 118/723 R; 219/395; 219/398
(58) Field of Search ............................ 156/345; 118/715, 118/723 R, 723 E, 723 I, 724; 219/390, 385, 393, 395, 398

(56) References Cited
U.S. PATENT DOCUMENTS 5,961,850 * 10/1999 Satou et al. ........................... 156/345

* cited by examiner

Primary Examiner—Thi Dang
(74) Attorney, Agent, or Firm—Tung & Associates

(57) ABSTRACT

An apparatus for controlling temperature of a process chamber which includes a plurality of heating elements mounted juxtaposed to a cylindrical chamber sidewall of the process chamber for heating the chamber, and a plurality of thermal sensors with one mounted juxtaposed to each of the plurality of heating elements such that the temperature of the chamber cavity can be more uniformly controlled. The method may be carried out by first forming a substantially air-tight chamber cavity by a cylindrical chamber sidewall, a top enclosure and a bottom enclosure, and then positioning a plurality of heating elements juxtaposed to and surrounds the cylindrical chamber sidewall and then mounting a plurality of thermal sensors to the plurality of heating elements with one sensor juxtaposed to each heating element, and then controlling the temperature of the process chamber by inputting signals from the plurality of thermal sensors into a controller and then outputting signals to the plurality of heating elements.

20 Claims, 2 Drawing Sheets

APPARATUS AND METHOD FOR CONTROLLING TEMPERATURE OF A CHAMBER

FIELD OF THE INVENTION

The present invention generally relates to an apparatus and a method for controlling temperature of a chamber and more particularly, relates to an apparatus and method for controlling temperature of a semiconductor process chamber in which a plurality of heating elements are mounted juxtaposed to the chamber wall and controlled by a plurality of thermal sensors such that a more uniform chamber temperature control is achieved.

BACKGROUND OF THE INVENTION

In the continuing miniaturization of semiconductor devices, one of the keys to shrinking device geometries is the ability to construct very dense contact or interconnect structures such as that used in a multi-level metallization schemes. The critical processing step involves etching the contacts and interconnects to a dimension as small as 0.35 $\mu$m or even 0.25 $\mu$m in diameter in applications for a 64 or 256 megabit DRAMs or other high-density logic devices. To fully implement the process, high selectivity of oxide to the underlying polysilicon or silicide is a key requirement. A high-density plasma etch process utilizing fluorine chemistry is ideal for the high selectivity etch process. A suitable equipment to be used for the process is supplied by the Applied Materials, Inc. of Santa Clara, Calif. Under the tradename of Centura Omega™ dielectric etch system. For instance, an oxide etch process can be performed in such an equipment by etching 8,000 Å to 12,000 Å of doped oxide down to a nitride layer. The etch step uses a well-characterized $C_2F_6$ or $C_3F_8$ chemistry to etch the oxide and stopping at the nitride layer. In order to avoid or to minimize a polymer film deposition during the etch process, a high density plasma source powered by a 2 MHZ RF signal is used. The source generates an ion density of about $1 \times 10^{12}$ cm$^{-3}$. Free fluorine atoms are removed or scavenged from the reaction chamber through the use of a heated silicon top plate.

Referring initially to FIG. 1, a cross-sectional view is shown of a typical plasma etch reactor equipped with a silicon ceiling as a scavenging surface. The silicon ceiling is a source of silicon atoms which scavenge fluorine out of the plasma to thereby provide a desired carbon-to-fluorine ratio forming a carbon-rich polymer impervious to the fluorine in the plasma over the non-oxide (i.e., polysilicon or silicon nitride) film. In a typical etching process, a reactant gas such as $C_2F_6$ is excited sufficiently to generate a plasma inside the reactor chamber and to produce ions and free radicals of F and $CF_3$. The F radicals etch any silicon dioxide film on the wafer, while carbon and fluorine atoms or ions in the plasma combine on the wafer surface to form a polymer.

The polymer disassociates when formed on silicon dioxide surfaces due to the effect of oxygen freed from the silicon dioxide film during the etch process, and due to the effect of fluorine in the plasma. However, when polymer is formed on non-oxide film (i.e., polysilicon or silicon nitride), the polymer accumulates due to the lack of oxygen in the underlying non-oxide film. This formation inhibits etching of the underlying non-oxide film and thereby provides a pronounced etch selectivity of the oxide film over the non-oxide film. The selectivity is of great importance when etching vias through a silicon dioxide layer overlying a non-oxide layer which is not to be etched. The selectivity is limited if the polymer formed over the polysilicon layer contains more than 40% fluorine by weight, because such polymers are susceptible to being attacked by fluorine in the plasma, and therefore provide only limited protection to the underlying polysilicon layer.

FIG. 1 shows an inductively coupled plasma etch reactor of the type generally used. The reactor includes a vacuum chamber 10 enclosed by a cylindrical quartz sidewall 12 and a bottom 14 including a cathode assembly on which a silicon wafer 16 is held by a retractable annular holder 18 on a pedestal 19. The ceiling 20 is made of crystalline silicon and heated by an overlying heating element 22 connected to a temperature controller (not shown). A cylindrical aluminum top wall 24 rests on the quartz sidewall 12 and supports an overlying cooling element 26 in which coolant is circulated through water jacket 28 as shown in FIG. 2. This arrangement cools the quartz sidewall 12 through the aluminum cylindrical top wall 24.

A helical cylindrical antenna coil 30 is wrapped around the cylindrical quartz sidewall 12 and is connected to an RF energy source 32 to inductively couple energy to the plasma in the chamber 10. A ceramic cylindrical cover 34 made of materials such as $Al_2O_3$ or $Si_2N_4$ surrounds the antenna coil 30.

A gate valve-vacuum pump assembly 36 draws gas from the chamber 10 through an opening in the chamber body 38 to maintain a vacuum in the chamber 10 through an opening in the chamber body 38 to maintain a vacuum in the chamber 10 determined by a pressure control device 40. A gas feed 42 feeds reactant gases such as $C_2F_6$ into the chamber 10.

In order to maintain the temperature of the interior surface of the quartz sidewall 12 well above 170° C. a single heating element (not shown) rests in the interior of the ceramic cover 34 near the bottom of the quartz sidewall 12 and is connected to an electrical source (not shown). The temperature of the heating element is monitored by a thermal sensor 28 which feeds a signal to a controller (not shown).

The temperature of the silicon ceiling 20 determines the rate at which silicon atoms scavenge the plasma within the chamber 10 and therefore affects the carbon-to-flourine plasma ratio providing a polymer carbon content greater than 60% by weight. Such temperature control of the ceiling 20 is provided by a controller governing the ceiling heat source in accordance with a signal received from a thermocouple 44 attached to the silicon ceiling 20. Heat conduction to the silicon ceiling 20 is set by a suitable air gap between the heater 22 and the ceiling 20.

During an etching process, the RF power source 32 used is in the range of 2,000–3,000 watts at about 2 MHz. The bias RF power source 46 connected to the pedestal 19 is in the range of 500–1500 watts at 1.8 MHZ depending on the size of the wafer 16. The silicon ceiling temperature is in the range of 200°–300° C., and is normally set at approximately 260° C. The quartz sidewall interior surface temperature is in the range of between 170° C. and 230° C, and is normally set at 220° C. The $C_2F_6$ gas flow rate is between 20–50 standard cubic centimeters per minute and the chamber pressure is between 1–10 millitorr.

In a typical etching process for oxide films, a high density, low pressure plasma is used. The chemistry involved is the dissociation of $C_2F_6$ into components of $CF_2$ F and C. The $CF_2$ is the active etching component of the gas, while F and C forms a fluorocarbon polymer that deposits on any surface that is relatively cool (i.e., at a temperature of 100° C. or below).

A cross-sectional view of the quartz sidewall 12 which contains the chamber cavity 10 for a conventional plasma etch chamber is shown in FIG. 2. A heating element 50 is contained in the interior of a ceramic cover (not shown) in-between the quartz sidewall 12 and the helical cylindrical antenna 30. In a conventional etcher, or for most other semiconductor process chambers, a single heating element 50 is utilized with its temperature monitored by a single thermal sensor 28. In the chamber cavity 10, processing difficulties frequently occur due to a poor temperature uniformity achieved across the chamber cavity. For instance, during a plasma etching process, where the quartz sidewall 12 is maintained at a temperature well above 170° C. and normally at a temperature of about 220° C. a temperature variation as high as 30° C. within the chamber cavity 10 is observed. This creates a serious problem in a plasma etching process resulting in a large variance in the etch rates at different locations in the cavity. A semiconductor substrate that has a non-uniform top layer is frequently obtained after the etching process. The conventional heating method of utilizing a single heating element monitored by a single thermal sensor is therefore inadequate for achieving a uniform process environment during a semiconductor process, regardless an etching, a deposition or any other process.

It is therefore an object of the present invention to provide an apparatus for controlling temperature of a process chamber in semiconductor processing that does not have the drawbacks or shortcomings of the conventional apparatus.

It is another object of the present invention to provide a process chamber for a semiconductor substrate that contains a cylindrical chamber sidewall which is heated by a plurality of heating elements.

It is a further object of the present invention to provide a process chamber for a semiconductor substrate that is equipped with a cylindrical chamber sidewall heated by at least two heating elements and monitored by at least two thermal sensors.

It is another further object of the present invention to provide a process chamber for a semiconductor substrate that is equipped with a cylindrical chamber sidewall fabricated in quartz and heated by a plurality of heating elements.

It is still another object of the present invention to provide a process chamber for a semiconductor substrate that is equipped with a cylindrical shaped quartz sidewall heated by a plurality of heating elements and energized by a helical cylindrical antenna coil.

It is yet another object of the present invention to provide a method for controlling temperature of a process chamber including the step of mounting a plurality of heating elements juxtaposed to and surround a cylindrical chamber sidewall.

It is still another further object of the present invention to provide a method for controlling temperature of a process chamber including the steps of positioning a plurality of heating elements juxtaposed to and surround a cylindrical chamber sidewall, and mounting a plurality of thermal sensors to the plurality of heating elements with one thermal sensor juxtaposed to each heating element.

It is yet another further object of the present invention to provide a plasma etch chamber which includes a cylindrical chamber sidewall, a plurality of heating elements mounted juxtaposed to the sidewall, a plurality of thermal sensors with one mounted to each of the plurality of heating elements, and a temperature controller for controlling temperature of the chamber cavity.

SUMMARY OF THE INVENTION

In accordance with the present invention, an apparatus and a method for controlling temperature of a process chamber are provided. In a preferred embodiment, a process chamber for a semiconductor substrate is provided which includes a cylindrical chamber sidewall, a top enclosure and a bottom enclosure forming a substantially air-tight chamber, a first plurality of heating elements mounted juxtaposed to the cylindrical chamber wall for heating the chamber, and a first plurality of thermal sensors with one mounted juxtaposed to each of the first plurality of heating elements such that the chamber can be uniformly heated.

In the process chamber for a semiconductor substrate, the first plurality of heating elements includes two or more heating elements, or three heating elements. The first plurality of thermal sensors may include two or more thermal sensors, or three thermal sensors. The chamber may further include a controller for receiving input signals from the first plurality of thermal sensors and for sending output signals to the first plurality of heating elements.

The first plurality of heating elements may be positioned head-to-tail in a toroidal shape surrounding the cylindrical chamber sidewall. The process chamber may further include a helical cylindrical antenna coil that is wrapped around the cylindrical chamber sidewall. The process chamber may be suitably a plasma etch chamber or any other semiconductor process chambers such as those used in deposition or in implantation. The cylindrical chamber sidewall may be fabricated of quartz.

The present invention is further directed to a method for controlling temperature of a process chamber which can be carried out by the operating steps of forming a substantially air-tight chamber by a cylindrical chamber sidewall, a top enclosure and a bottom enclosure, positioning a first plurality of heating elements juxtaposed to and surround the cylindrical chamber sidewall, mounting a first plurality of thermal sensors to the first plurality of heating elements with one thermal sensor juxtaposed to each heating element, and controlling temperature of the process chamber by inputting signals from the plurality of thermal sensors and outputting signals to the plurality of heating elements.

The method for controlling temperature of a process chamber may further include the step of positioning three heating elements in a head-to-tail arrangement juxtaposed to and surround a cylindrical chamber sidewall. The method may further include the step of mounting three thermal sensors to three heating elements with one sensor juxtaposed to each heating element. The method may further include the step of positioning a first plurality of heating elements head-to-tail in a toroidal shape surrounding and juxtaposed to the cylindrical chamber sidewall. The method may further include the step of controlling temperature of the process chamber such that temperature deviation between any two points in the chamber cavity is less than 30° C. The method may further include the step of generating a plasma in the process chamber by a helical cylindrical antenna coil wrapped around the cylindrical chamber sidewall.

In an alternate embodiment, a plasma etch chamber is provided which includes a cylindrical chamber sidewall, a top enclosure and a bottom enclosure forming a vacuum-tight chamber, a plasma source for producing charged particles of an active gas, an electrostatic chuck for electrostatically holding a substrate thereon, a first plurality of heating elements mounted juxtaposed to the cylindrical chamber wall for heating the chamber, a first plurality of thermal sensors with one mounted to each of the first plurality of heating elements, and a temperature controller for inputting signals from the first plurality of thermal sensors and outputting signals to the first plurality of heating elements.

In the plasma etch chamber, the plasma source may be a helical cylindrical antenna coil wrapped around the cylindrical chamber sidewall. The plasma etch chamber may further include at least two heating elements positioned head-to-tail in a toroidal shape surrounding and juxtaposed to the cylindrical chamber sidewall which may be fabricated in quartz. The first plurality of heating elements may include three heating elements and the first plurality of thermal sensors may include three thermal sensors.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus of a process chamber used in semiconductor processing which is capable of achieving a more uniform temperature in a chamber cavity during the process. The process chamber may be constructed by a cylindrical chamber sidewall formed of a quartz material, a top enclosure and a bottom enclosure forming a substantially air-tight chamber cavity. Outside the chamber cavity, a plurality of heating elements or at least two heating elements are mounted juxtaposed to the cylindrical chamber sidewall for heating the chamber which is monitored by a plurality of thermal sensors, for instance, by at least two thermal sensors with one mounted juxtaposed to each of the plurality of heating elements to achieve a more uniform temperature control in the chamber cavity.

The present invention further provides a method for controlling temperature in a process chamber by first forming a substantially air-tight chamber by a cylindrical chamber sidewall made of quartz, a top enclosure such as a silicon ceiling, and a bottom enclosure such as an electrostatic chuck for carrying a substrate thereon. A plurality of heating elements are mounted juxtaposed to and surrounds the cylindrical chamber sidewall. A suitable number such as three heating elements can be utilized. A plurality of thermal sensors are then mounted to the plurality of heating elements with one thermal sensor juxtaposed to each heating element. The temperature of the chamber cavity is controlled by inputting signals from the plurality of thermal sensors into a controller and then outputting signals to the plurality of heating elements from the temperature controller.

The present invention may further provide a plasma etch chamber that is equipped with a present invention novel temperature control apparatus. In the plasma etch chamber, a cylindrical chamber sidewall such as one made of quartz is first provided and sealed by a top enclosure and a bottom enclosure to form a vacuum-tight chamber. A plasma source such as a helical cylindrical antenna coil for producing charged particles of an active gas is then mounted to the chamber sidewall. An electrostatic chuck for electrostatically holding a substrate thereon is further provided as the bottom enclosure for the chamber, while a silicon scavenging ceiling is used as the top enclosure. Outside the cylindrical chamber sidewall, a plurality of heating elements, for instance, three heating elements are mounted juxtaposed to the cylindrical chamber sidewall for heating the chamber and are monitored by a three thermal sensors with one mounted to each heating element. A temperature controller is used for inputting signals from the first plurality of thermal sensors and for outputting signals to the first plurality of heating elements.

Figure 1:
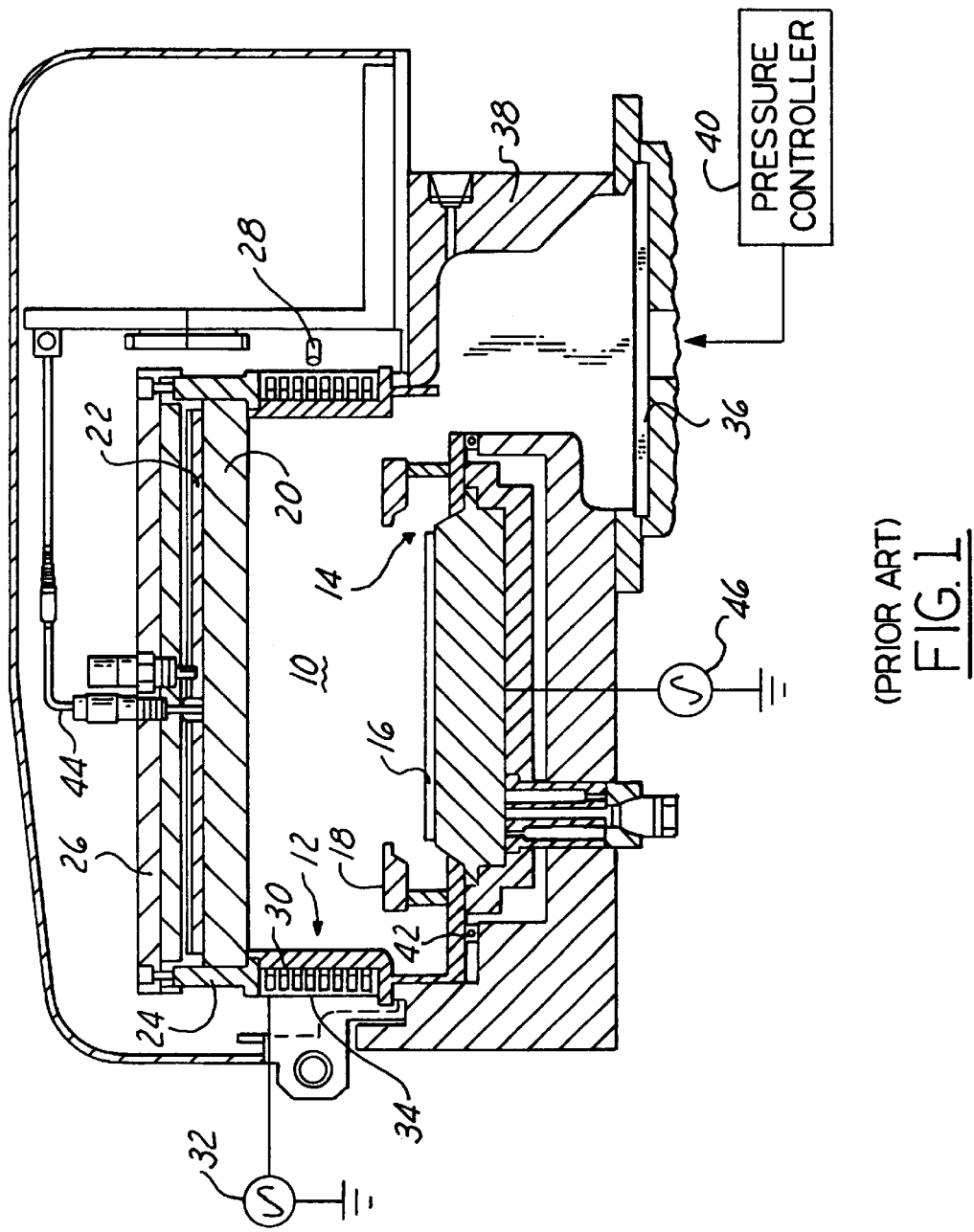
FIG. 1 is a cross-sectional view of a typical, commercial plasma etch chamber for a semiconductor substrate.
Figure 2:
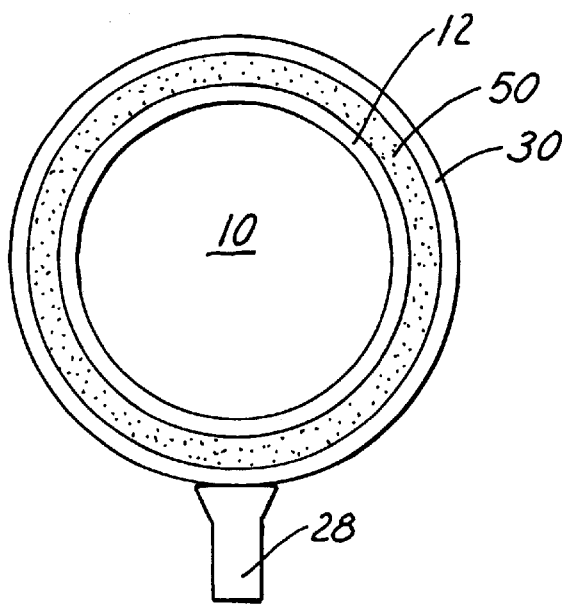
FIG. 2 is a cross-sectional view of a chamber cavity, a heating element and an antenna coil in a conventional plasma etcher.
Figure 3:
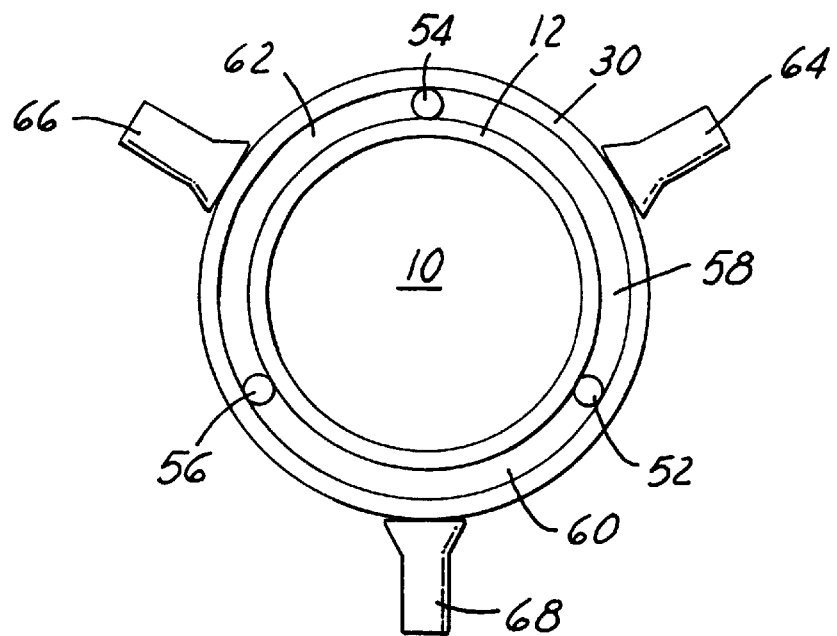
FIG. 3 is a cross-sectional view of the present invention process chamber that utilizes a plurality of heating elements monitored by a plurality of thermal sensors.

The present invention novel temperature control apparatus is shown in a cross-sectional view in FIG. 2. The temperature control apparatus for the chamber cavity 10 consists of three heating elements 58, 60 and 62 which are thermally insulated by insulators 52, 54 and 56. The thermal insulators 52, 54 and 56 enable a relatively independent control of the three separate heating elements such that the amount of heat provided by the elements can be individually, and independently controlled by a temperature controller (not shown). It should be noted that, the arrangement of three separate heating elements 58, 60 and 62 shown in FIG. 3 is merely one implementation example. Any other suitable numbers of heating elements that are insulated from each other may be used. The consideration for determining the number of heating elements used are the size of the process chamber, the geometry of the process chamber, the operating temperature range of the process chamber and the amount of heat output from the heating elements. Other considerations may further determine the number and geometry of the heating elements.

It should be further noted that, in the configuration shown in FIG. 3, three separate heating elements are utilized which are arranged in a head-to-tail configuration with the thermal insulators positioned thereinbetween. The three heating elements are arranged in a toroidal shape, or in a doughnut-like shape surrounding the cylindrical sidewall 12 which forms the chamber cavity 10. The cylindrical sidewall 12 is fabricated of a quartz material for its high thermal conductivity and high thermal radiant transmittance. In order to accomplish an independent control of heat output from the three heating elements 58, 60 and 62 based on the need of heat input in the process chamber 10, three separate thermal sensors 64, 66 and 68 are utilized. Each of the three thermal sensors 64, 66 and 68 is positioned juxtaposed to one of the heating elements 58, 60 and 62. This enables an independent monitoring of the heating elements by its own thermal sensor and correspondingly, determining its heat output into the chamber cavity 10.

For instance, inside the process chamber cavity 10, numerous thermal sensing devices such as thermal couples may be positioned at predetermined positions and the precise temperature at the locations can be monitored by a temperature controller. The temperature controller then determines the heat input needed in the chamber cavity 10 by sensing the temperature of each heating element and determines accordingly the heat output required from each heating element. It is desirable that at least one thermal sensor is paired to one heating element. When a large heating element is utilized, more than one thermal sensor may be used to monitor the single heating element, thus providing the control of heat output from the element. A temperature controller (not shown) can be suitably used to receive input signals from the thermal sensors 64, 66 and 68 and then outputs signals to the three heating elements 58, 60 and 62 to individually control the amount of heat output from the heating elements. The present invention novel apparatus can therefore be used to more effectively control the temperature of a chamber cavity when compared to that used in a conventional process chamber, i.e., a single heating element monitored and controlled by a single thermal sensor.

The present invention novel apparatus and a method for using the novel temperature control apparatus have therefore been amply described in the above descriptions and shown in the appended drawing of FIG. 3.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows:

1. A process chamber for a semiconductor substrate comprising:
   a cylindrical chamber sidewall, a top enclosure and a bottom enclosure forming a substantially air-tight chamber,
   a first plurality of heating elements mounted juxtaposed to and circumferentially dividing said cylindrical chamber sidewall for heating said chamber, and
   a first plurality of thermal sensors with one mounted juxtaposed to each of said first plurality of heating elements such that said chamber is uniformly heated.

2. A process chamber for a semiconductor substrate according to claim 1, wherein said first plurality of heating elements comprises two or more heating elements.

3. A process chamber for a semiconductor substrate according to claim 1, wherein said first plurality of heating elements comprises three heating elements.

4. A process chamber for a semiconductor substrate according to claim 1, wherein said first plurality of thermal sensors comprises two or more thermal sensors.

5. A process chamber for a semiconductor substrate according to claim 1, wherein said first plurality of thermal sensors comprises three thermal sensors.

6. A process chamber for a semiconductor substrate according to claim 1 further comprising a controller for receiving input signals from said first plurality of thermal sensors and for sending output signals to said first plurality of heating elements.

7. A process chamber for a semiconductor substrate according to claim 1, wherein said first plurality of heating elements are positioned head-to-tail in a toroidal shape surrounding said cylindrical chamber sidewall.

8. A process chamber for a semiconductor substrate according to claim 1 further comprising a helical cylindrical antenna coil wrapped around said cylindrical chamber sidewall.

9. A process chamber for a semiconductor substrate according to claim 1, wherein said process chamber is a plasma etch chamber.

10. A process chamber for a semiconductor substrate according to claim 1, wherein said cylindrical chamber sidewall is a quartz sidewall.

11. A method for controlling temperature of a process chamber comprising the steps of:
    forming a substantially air-tight chamber by a cylindrical chamber by a cylindrical chamber sidewall, a top enclosure and a bottom enclosure,
    positioning a first plurality of heating elements juxtaposed to and circumferentially divide said cylindrical chamber sidewall,
    mounting a first plurality of thermal sensors to said first plurality of heating elements with one thermal sensor juxtaposed to each heating element, and
    controlling temperature of said process chamber by inputting signals from said plurality of thermal sensors into and outputting signals to said plurality of heating elements from a controller.

12. A method for controlling temperature of a process chamber according to claim 11 further comprising the step of positioning three heating elements in a head-to-tail juxtaposed to and surround said cylindrical chamber sidewall.

13. A method for controlling temperature of a process chamber according to claim 11 further comprising the step of mounting three thermal sensors to three heating elements with one thermal sensor juxtaposed to each heating element.

14. A method for controlling temperature of a process chamber according to claim 11 further comprising the step of positioning said first plurality of heating elements head-to-tail in a toroidal shape surrounding and juxtaposed to said cylindrical chamber sidewall.

15. A method for controlling temperature of a process chamber according to claim 11 further comprising the step of controlling temperature of said process chamber such that temperature deviation between any two points in said chamber is less than 30° C.

16. A method for controlling temperature of a process chamber according to claim 11 further comprising the step of generating a plasma in said process chamber by a helical cylindrical antenna coil wrapped around said cylindrical chamber sidewall.

17. A plasma etch chamber comprising:
    a cylindrical chamber sidewall, a top enclosure and a bottom enclosure forming a vacuum-tight chamber,
    a plasma source for producing charged particles of an active gas,
    an electrostatic chuck for electrostatically holding a substrate thereon,
    a first plurality of heating elements mounted juxtaposed to and circumferentially divide said cylindrical chamber sidewall for heating said chamber,
    a first plurality of thermal sensors with one mounted to each of said first plurality of heating elements, and
    a temperature controller for inputting signals to said first plurality of thermal sensors and outputting signals to said first plurality of heating elements.

18. A plasma etch chamber according to claim 17, wherein said plasma source is a helical cylindrical antenna coil wrapped around said cylindrical chamber sidewall.

19. A plasma etch chamber according to claim 17 further comprising at least two heating elements positioned head-to-tail in a toroidal shape surrounding and juxtaposed to said cylindrical chamber sidewall.

20. A plasma etch chamber according to claim 17, wherein said first plurality of heating elements comprises three heating elements and said first plurality of thermal sensors comprises three thermal sensors.

* * * * *